United States Patent [19]

Sekiya et al.

[11] Patent Number: 5,269,881
[45] Date of Patent: Dec. 14, 1993

[54] PLASMA PROCESSING APPARATUS AND PLASMA CLEANING METHOD

[75] Inventors: Hidenori Sekiya; Kenji Shirakawa, both of Fukuoka, Japan

[73] Assignee: Mitsubishi Denki Kabushiki Kaisha, Tokyo, Japan

[21] Appl. No.: 934,828

[22] Filed: Aug. 25, 1992

[30] Foreign Application Priority Data

Sep. 3, 1991 [JP] Japan .................................. 3-222766

[51] Int. Cl.$^5$ ..................... H01L 21/306; B44C 1/22; C23F 1/00
[52] U.S. Cl. ................................... 156/643; 156/656; 156/665; 156/345; 134/1
[58] Field of Search ............... 156/643, 646, 656, 345, 156/665; 134/1, 31, 102; 204/192.32, 192.37, 298.31, 298.34, 298.38, 298.39

[56] References Cited

U.S. PATENT DOCUMENTS

| | | | |
|---|---|---|---|
| 4,786,352 | 11/1988 | Benzing | 156/345 |
| 4,786,392 | 11/1988 | Kruchowski et al. | 204/192.32 X |
| 5,068,002 | 11/1991 | Monroe | 156/345 |
| 5,084,125 | 1/1992 | Aoi | 156/345 |

FOREIGN PATENT DOCUMENTS 2-201923  8/1990  Japan .

*Primary Examiner*—William A. Powell
*Attorney, Agent, or Firm*—Lowe, Price, LeBlanc & Becker

[57] ABSTRACT

There are disclosed apparatus and method for eliminating, by plasma cleaning, reaction products which are generated by etching and stick to an inner wall surface of a chamber. First to third conductive blocks (90a to 90c) are mounted on the inner wall surface of the chamber (50) through an insulator (92). A high-frequency electric field is applied sequentially between a first electrode (61) and the respective conductive blocks (90a to 90c) while a reactive gas is introduced into an internal space (51) of the chamber (50), to produce a plasma of the reactive gas. The reaction products which stick to the respective conductive blocks (90a to 90c) are sequentially gasified by the plasma of the reactive gas and exhausted to the outside of the chamber (50) to be eliminated.

33 Claims, 10 Drawing Sheets

PLASMA PROCESSING APPARATUS AND PLASMA CLEANING METHOD

BACKGROUND OF THE INVENTION

1. Field of the Invention

The present invention relates to a plasma processing apparatus such as RIE (reactive ion etching) and CVD apparatuses and to a plasma cleaning method for use in the same.

2. Description of the Background Art

FIG. 11 is a cross-sectional view of a conventional RIE apparatus AP. There are provided first and second electrode conductors 3 and 4 in an internal space 2 of a conductive chamber 1. The first and second electrodes 3 and 4 are spaced apart from each other, and a clearance 5 is formed between the electrodes 3 and 4.

The first electrode 3 is supported by an insulator 6 mounted on an inner wall surface of the chamber 1 and is electrically insulated from the chamber 1 by the insulator 6. An extraction electrode 7 extending from the first electrode 3 is connected to a high-frequency power source 8 located outside the chamber 1.

The second electrode 4 is supported through a conductive pillar 9 by the inner wall of the chamber 1 and is electrically connected to the chamber 1 through the pillar 9. The second electrode 4 and pillar 9 are hollow in core, which forms a reactive gas introduction path 10. A multiplicity of small holes 4b are formed in a major surface 4a of the second electrode 4 which surface is opposite to the first electrode 3. The reactive gas introduction path 10 communicates with the internal space 2 of the chamber 1 by means of the small holes 4b.

A reactive gas conduit 11 is coupled to an outer wall of the chamber 1 in corresponding relation to the reactive gas introduction path 10. A reactive gas supply cylinder not shown is connected to the reactive gas conduit 11. When a reactive gas is introduced from the reactive gas supply cylinder to the reactive gas conduit 11, the reactive gas enters the internal space 2 of the chamber 1 by way of the reactive gas introduction path 10 and small holes 4b.

A predetermined position 12 on the outer wall of the chamber 1 is electrically connected to the high-frequency power source 8. The chamber 1 is formed with an outlet 13, which is connected to a vacuum exhaust mechanism (not shown) such as a vacuum pump.

In the RIE apparatus AP, the selective etching of a film to be etched which is formed on a major surface of a semiconductor wafer 20 is performed as follows. Initially, the semiconductor wafer 20 is placed on the first electrode 3, and the pressure in the internal space 2 of the chamber 1 is reduced by the vacuum exhaust mechanism.

The reactive gas is introduced from the reactive gas supply cylinder into the internal space 2 of the chamber 1 while a high-frequency current is fed between the electrodes 3 and 4 from the high-frequency power source 8. This allows a high-frequency electrical discharge to occur in the clearance 5 between the electrodes 3 and 4. The resultant high-frequency electric field causes the production of the plasma of the reactive gas, which etches the film formed on the semiconductor wafer 20. Reaction products generated by the etching are discharged through the outlet 13 to the outside of the chamber 1.

In the conventional RIE apparatus AP, however, some of the reaction products generated by the etching are not discharged smoothly but are diffused within the chamber 1 to stick to the electrodes 3, 4 and inner wall surface of the chamber 1. Such reaction products, when sticking to the electrodes 3, 4 and inner wall surface of the chamber 1 in large quantities, peel off and fall onto the semiconductor wafer 20 as a foreign matter, resulting in a defective plasma processing of the semiconductor wafer 20. For this reason, it is necessary to periodically clean the electrodes 3, 4 and inner wall surface of the chamber 1.

Recently, a plasma cleaning method has been proposed in which the reaction products inside the chamber 1 are eliminated by using the plasma in the plasma processing apparatuses such as RIE apparatuses.

In this method, another reactive gas is introduced into the internal space 2 of the chamber 1, and the plasma of the reactive gas is produced by the high-frequency electrical discharge similar to that in the etching processing. The plasma gasifies the reaction products which stick to the portions inside the chamber 1, and the gasified reaction products are eliminated by suction.

In the conventional RIE apparatus AP, however, since the produced plasma is designed to concentrate in the clearance 5 between the electrodes 3 and 4 for the purpose of efficient plasma etching, the plasma does not reach the inner wall surface of the chamber 1. The reaction products which stick to the inner wall surface of the chamber 1 cannot be sufficiently eliminated by the plasma cleaning. There has been a problem that the reaction products which stick to the portions inside the chamber 1 cannot be positively eliminated.

SUMMARY OF THE INVENTION

The present invention is directed to a plasma processing apparatus for performing a plasma processing on a material to be processed. According to the present invention, the apparatus comprises (a) a chamber having an internal space; (b) a reactive gas supply mechanism connected to the chamber for introducing a reactive gas into the internal space of the chamber; (c) an exhaust mechanism connected to the chamber; (d) a first electrode conductor disposed in the internal space of the chamber and being capable of placing the material thereon; (e) a second electrode conductor disposed opposite to the first electrode conductor in the internal space of the chamber and insulated electrically from the first electrode conductor; (f) a second conductive block mounted on an inner wall surface of the chamber in electrically insulated relation to the chamber and insulated electrically from the first and second electrode conductors; and (g) selective voltage supply means connected to the first and second electrode conductors and to the conductive block and being capable of switching from a first voltage supply mode to a second voltage supply mode, and vice versa, the first voltage supply mode being a mode in which voltage is applied across the first and second electrode conductors, the second voltage supply mode being a mode in which voltage is applied across the conductive block and one of the first and second electrode conductors.

In another aspect of the present invention, the plasma processing apparatus comprises (a) a chamber having an internal space; (b) a reactive gas supply mechanism connected to the chamber for introducing a reactive gas into the internal space of the chamber; (c) an exhaust mechanism connected to the chamber; (d) a first electrode conductor disposed in the internal space of the chamber and being capable of placing the material thereon; (e) a second electrode conductor disposed opposite to the first electrode conductor in the internal space of the chamber and insulated electrically from the first electrode conductor; (f) a plurality of conductive blocks mounted on an inner wall surface of the chamber in electrically insulated relation to the first and second electrode conductors and insulated electrically from each other; and (g) selective voltage supply means connected to the first and second electrode conductors and to the plurality of conductive blocks and being capable of switching from a first voltage supply mode to at least one of second and third voltage supply modes, and vice versa, the first voltage supply mode being a mode in which voltage is applied across the first and second electrode conductors, the second voltage supply mode being a mode in which voltage is applied selectively across one of the first and second electrode conductors and the plurality of conductive blocks, the third voltage supply mode being a mode in which voltage is applied across the plurality of conductive blocks.

In still another aspect of the present invention, the plasma processing apparatus comprises (a) a conductive chamber having an internal space; (b) a reactive gas supply mechanism connected to the chamber for introducing a reactive gas into the internal space of the chamber; (c) an exhaust mechanism connected to the chamber; (d) a first electrode conductor disposed in the internal space of the chamber and insulated electrically from the chamber, the first electrode conductor being capable of placing the material thereon; (e) a second electrode conductor disposed opposite to the first electrode conductor in the internal space of the chamber and insulated electrically from the chamber and the first electrode conductor; and (f) selective voltage supply means connected to the first and second electrode conductors and to the chamber and being capable of switching from a first voltage supply mode to a second voltage supply mode, and vice versa, the first voltage supply mode being a mode in which voltage is applied across the first and second electrode conductors, the second voltage supply mode being a mode in which voltage is applied across the chamber and one of the first and second electrode conductors.

In a further aspect of the present invention, the plasma processing apparatus comprises (a) a chamber having an internal space and a plurality of conductive portions insulated electrically from each other; (b) a reactive gas supply mechanism connected to the chamber for introducing a reactive gas into the internal space of the chamber; (c) an exhaust mechanism connected to the chamber; (d) a first electrode conductor disposed in the internal space of the chamber and insulated electrically from the plurality of conductive portions, the first electrode conductor being capable of placing the material thereon; (e) a second electrode conductor disposed opposite to the first electrode conductor in the internal space of the chamber and insulated electrically from the plurality of conductive portions and the first electrode conductor; and (f) selective voltage supply means connected to the first and second electrode conductors and to the plurality of conductive portions and being capable of switching from a first voltage supply mode to at least one of second and third voltage supply modes, and vice versa, the first voltage supply mode being a mode in which voltage is applied across the first and second electrode conductors, the second voltage supply mode being a mode in which voltage is applied selectively across one of the first and second electrode conductors and the plurality of conductive portions, the third voltage supply mode being a mode in which voltage is applied across the plurality of conductive portions.

The present invention is also directed to a plasma cleaning method for use in a plasma processing apparatus adapted such that first and second electrode conductors are disposed opposite to each other in an internal space of a chamber and such that voltage is applied across the first and second electrode conductors. According to the present invention, the method comprises the steps of (a) introducing a reactive gas into the internal space of the chamber; and (b) producing a plasma of the reactive gas by applying voltage across one of the first and second electrode conductors and a conductive block mounted on an inner wall surface of the chamber in parallel with the step (a) to clean an inside portion of the chamber by the plasma.

In another aspect of the present invention, the plasma cleaning method comprises the steps of (a) introducing a reactive gas into the internal space of the chamber; (b) producing a plasma of the reactive gas by applying voltage across one of the first and second electrode conductors and one conductive block selected among a plurality of conductive blocks mounted on an inner wall surface of the chamber and insulated from each other in parallel with the step (a) to clean an inside portion of the chamber by the plasma; and (c) repeating the step (b) while sequentially selecting each of the plurality of conductive blocks as the one conductive block.

In still another aspect of the present invention, the plasma cleaning method comprises the steps of (a) introducing a reactive gas into the internal space of the chamber; and (b) producing a plasma of the reactive gas by applying voltage across one of the first and second electrode conductors and a conductive portion exposed to an inner wall surface of the chamber in parallel with the step (a) to clean an inside portion of the chamber by the plasma.

In a further aspect of the present invention, the plasma cleaning method comprises the steps of (a) introducing a reactive gas into the internal space of the chamber; (b) producing a plasma of the reactive gas by applying voltage across one of the first and second electrode conductors and one conductive portion selected among a plurality of conductive portions exposed to an inner wall surface of the chamber and insulated from each other in parallel with the step (a) to clean an inside portion of the chamber by the plasma; and (c) repeating the step (b) while sequentially selecting each of the plurality of conductive portions as the one conductive portion.

The plasma processing apparatus and plasma cleaning method according to the present invention are adapted such that the plasma of the reactive gas is produced on the inner wall surface side of the chamber, whereby the reaction products which stick to the exposed portions in the chamber are exposed to the plasma to be eliminated. Therefore, the reaction products which stick to the portions inside the chamber can be positively eliminated.

In particular, each of the plurality of conductive blocks or conductive portions which are insulated from each other is sequentially selected for production of the plasma, thereby improving the elimination effects of the reaction products which stick to the respective portions inside the chamber.

It is an object of the present invention to provide a plasma processing apparatus and plasma cleaning method which are capable of positively eliminating, by plasma cleaning, reaction products which stick to portions inside a chamber.

These and other objects, features, aspects and advantages of the present invention will become more apparent from the following detailed description of the present invention when taken in conjunction with the accompanying drawings.

DESCRIPTION OF THE PREFERRED EMBODIMENTS

Apparatus of First Preferred Embodiment

Figure 1:
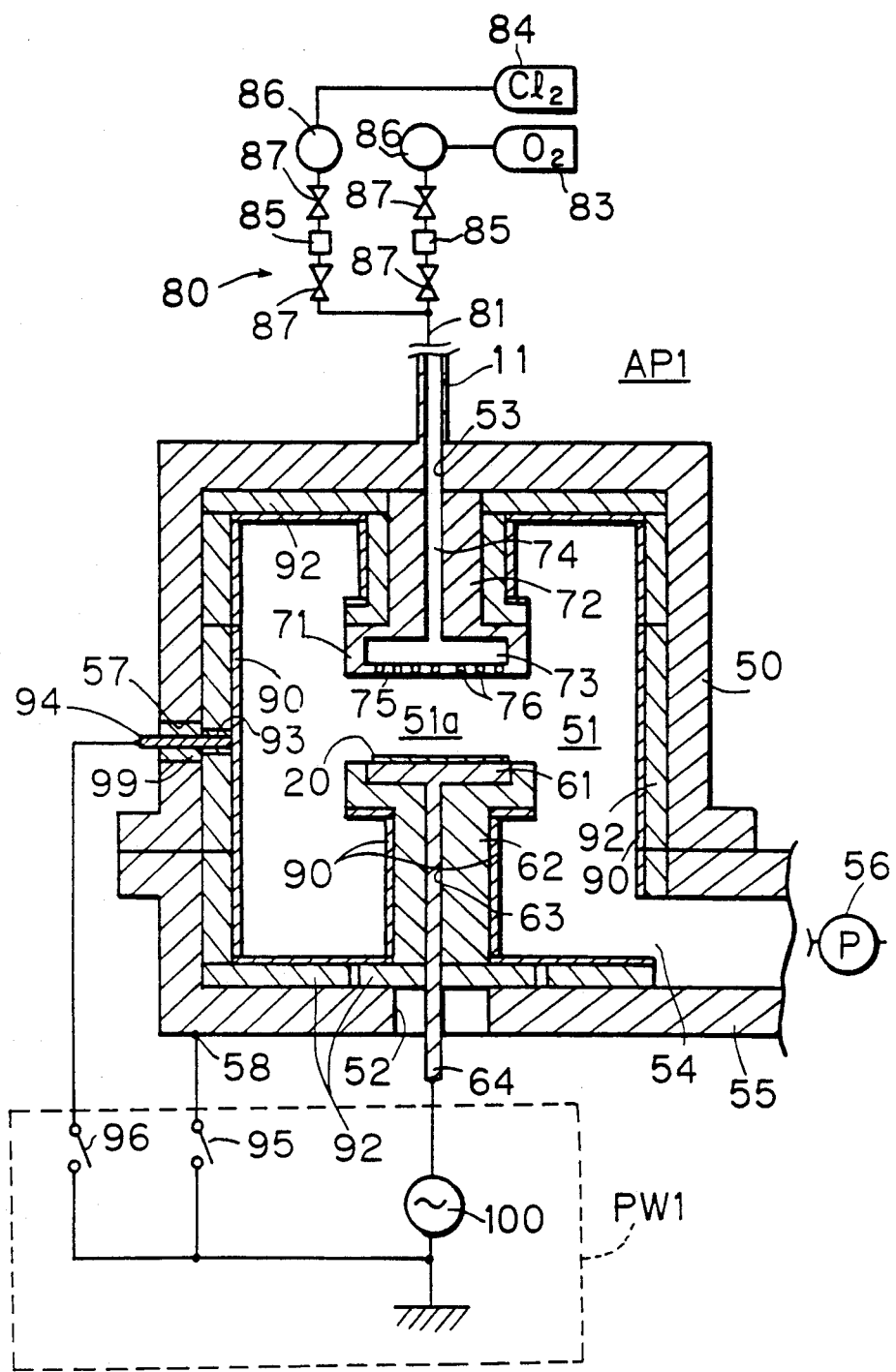
FIG. 1 is a schematic cross-sectional view of a plasma processing apparatus according to a first preferred embodiment of the present invention.

FIG. 1 is a schematic cross-sectional view of a parallel-plate RIE apparatus AP1 according to a first preferred embodiment of the present invention.

With reference to FIG. 1, a hollow chamber 50 which is an aluminum or stainless steel conductor defines an internal space 51 therein. In the internal space 51, first and second electrode conductors 61 and 71 are spaced apart from each other, and there is provided a clearance 51a between the electrode conductors 61 and 71.

The first electrode 61, except the top surface, is enclosed with an insulator 62 made of ceramic, teflon or glass (quartz glass). The first electrode 61 is supported by the insulator 62 mounted on the inner wall bottom surface of the chamber 50 and is electrically insulated from the chamber 50 by the insulator 62. There is formed a through hole 63 extending vertically in the center of the insulator 62. An extraction electrode 64 is inserted in the through hole 63 such that it extends from the first electrode 61 to the outside of the chamber 50 through a through hole 52 formed in the chamber 50. The diameter of the through hole 52 is sufficiently larger than that of the extraction electrode 64 so that the extraction electrode 64 is not in contact with the chamber 50.

The second electrode 71 is supported by the inner wall surface of the chamber 50 through a conductive pillar 72 and is electrically connected to the chamber 50 through the pillar 72. A space 73 is formed inside the second electrode 71. The pillar 72 is formed with a vertically extending reactive gas introduction path 74 which is adapted to communicate with the space 73. A multiplicity of small holes 76 are formed in a major surface 75 of the second electrode 71 (which surface is opposite to the first electrode 61). The space 73 communicates with the internal space 51 of the chamber 50 by means of the small holes 76. The chamber 50 is formed with a reactive gas inlet 53 in corresponding relation to the reactive gas introduction path 74. A reactive gas conduit 11 is coupled to the outer wall of the chamber 50 in corresponding relation to the reactive gas introduction path 74.

A reactive gas supply mechanism 80 for introducing a reactive gas into the internal space 51 of the chamber 50 is coupled to the reactive gas conduit 11 by way of a pipe 81. The pipe 81 is branched into two paths, one of the paths being coupled to an oxygen cylinder 83 via a mass flow controller 85 for flow rate, a regulator 86 for pressure control and a valve 87, the other being coupled to a chlorine cylinder 84 via another mass flow controller 85, another regulator 86 and another valve 87.

Oxygen and chlorine gases are selectively supplied to the reactive gas inlet 53 by the operations of the valves 87. The reactive gas supplied to the reactive gas inlet 53 is introduced into the internal space 51 through the reactive gas introduction path 74, space 73 and small holes 76.

The chamber 50 is formed with an outlet 54, to which an exhaust pipe 55 is coupled. The exhaust pipe 55 is coupled to a vacuum pump 56. The exhaust pipe 55 and vacuum pump 56 constitute an exhaust mechanism.

An insulator 92 composed of a plurality of insulative members is mounted over the inner wall surface of the chamber 50 and the outer periphery of the pillar 72. A conductive block 90 composed of a plurality of conductive plates which are electrically connected to each other is mounted on the insulator 92 and over the outer periphery of the insulator 62. The conductive plates of the conductive block 90 are aluminium plates whose surfaces are coated with alumina or aluminium plates treated with anodic oxide coating. The conductive block 90 is electrically insulated from the chamber 50 and the electrode 71 by the presence of the insulators 62 and 92, respectively.

A lead insertion hole 57 is formed in a portion of the wall of the chamber 50, and a lead insertion hole 93 is formed in the insulator 92 in corresponding relation to the hole 57. A lead 94 is inserted in the holes 57 and 93, one end of the lead 94 being electrically connected to the conductive block 90, the other end thereof being located outside the chamber 50. An insulator 99 is inserted between the chamber 50 and the outer periphery of the lead 94 to electrically insulate the lead 94 from the chamber 50.

A connection 58 on the outer wall surface of the chamber 50 is connected to a ground level side terminal of a high-frequency power source 100 through a first switch 95. The lead 64 is connected to a non-ground level side terminal of the high-frequency power source 100 through a second switch 96. When the first switch 95 is closed, the second electrode 71 is connected to the high-frequency power source 100. When the second switch 96 is closed, the conductive block 90 is connected to the high-frequency power source 100. The high-frequency power source 100 and the switches 95 and 96 constitute a selective voltage supply unit PW1.

Etching in First Preferred Embodiment

Figure 10:
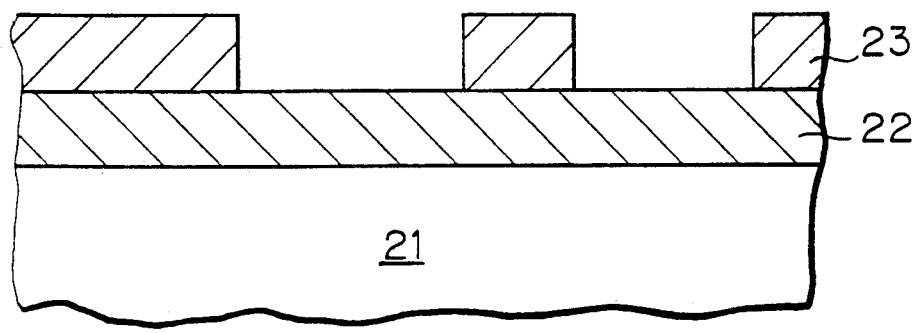
FIG. 10 is an enlarged cross-sectional view of a semiconductor wafer to be processed by the apparatuses.
Figure 11:
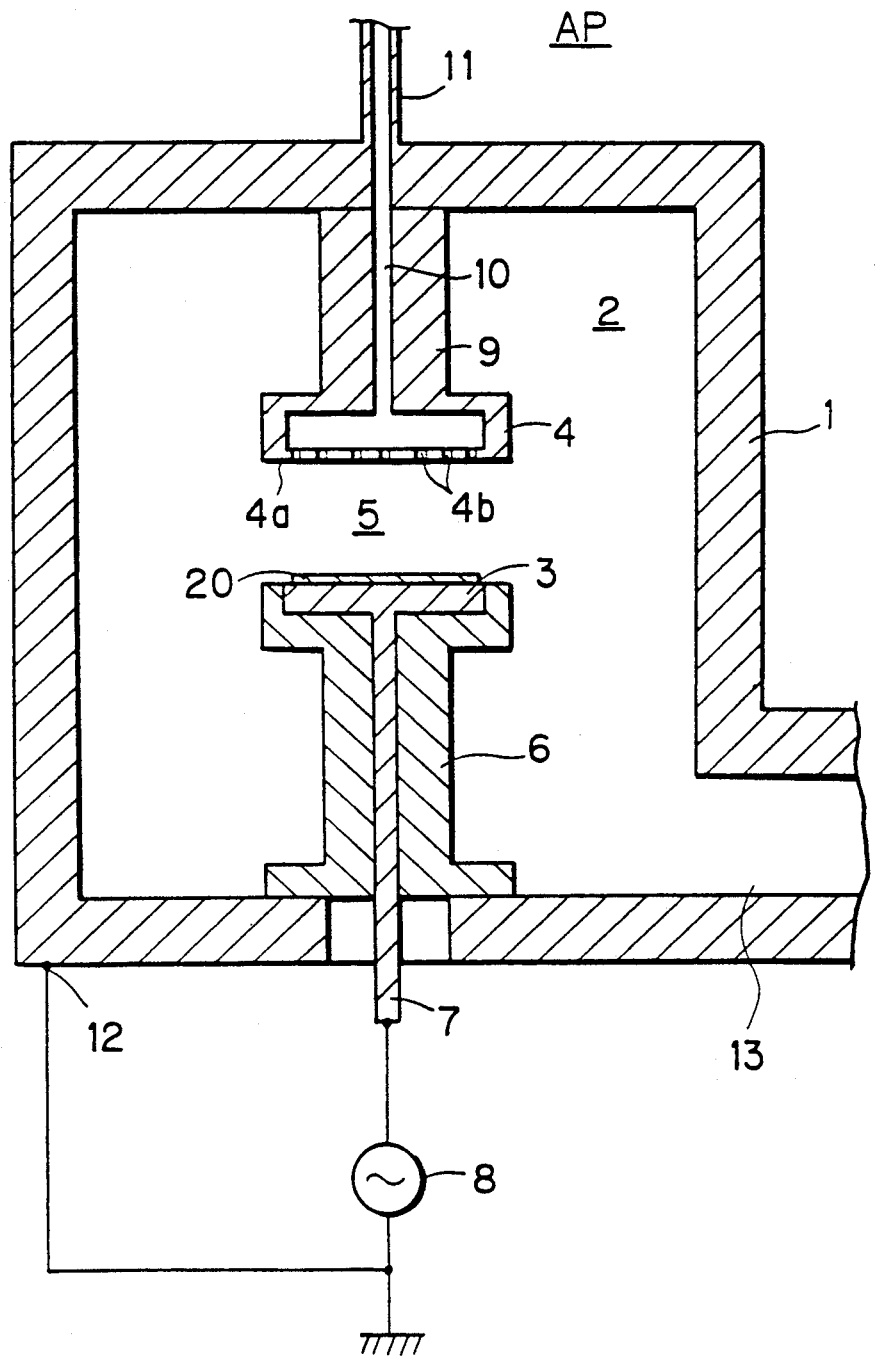
FIG. 11 is a schematic cross-sectional view of a conventional plasma processing apparatus.

Etching by the RIE apparatus AP1 will be described below. As shown by the enlarged cross-section of FIG. 10, a semiconductor wafer 20 to be processed includes a semiconductor substrate 21, an aluminium layer 22 to be etched which is formed on the substrate 21, and a resist pattern layer 23 formed on the aluminium layer 22. The aluminium layer 22 is selectively etched using the resist pattern layer 23 as a mask in the etching described below.

Initially, the semiconductor wafer 20 is introduced into the chamber 50 and is placed on the first electrode 61, as shown in FIG. 1.

While the pressure in the internal space 51 of the chamber 50 is reduced by driving the vacuum pump 56, the chlorine gas is supplied to the reactive gas inlet 53 to be introduced into the clearance 51a from the small holes 76.

The first switch 95 is closed with the second switch 96 being open. This permits a high-frequency voltage to be applied across the first and second electrodes 61 and 71, so that a high-frequency electric field is generated in the clearance 51a. The high-frequency electric field causes the production of the plasma of the chlorine gas, which selectively etches the aluminium layer 22 (of FIG. 10). The resist pattern layer 23, which is also exposed to the plasma, is partially etched.

In this etching, the aluminium layer 22 and resist pattern layer 23 react with the chlorine gas, resulting in the generation of gaseous reaction products. Most of the reaction products are discharged to the outside of the chamber 50 through the outlet 54, but some of them are diffused in the internal space 51 of the chamber 50 to stick to the electrodes 61, 71 and surface of the conductive block 90. The reaction products contain aluminiferous constituents scattered from the aluminium layer 22 and carbonaceous constituents scattered from the resist pattern layer 23.

On completion of the etching, the supply of the reactive gas and high-frequency current is cut off, and the semiconductor wafer 20 is taken out of the chamber 50.

Plasma Cleaning in First Preferred Embodiment

Description will be given on the elimination of the reaction products by plasma cleaning. Before starting the plasma cleaning, both of the first and second switches 95 and 96 are open.

First Step

While the pressure in the internal space 51 is reduced by the vacuum pump 56, the chlorine gas is introduced from the reactive gas supply mechanism 80 into the internal space 51.

Figure 2:
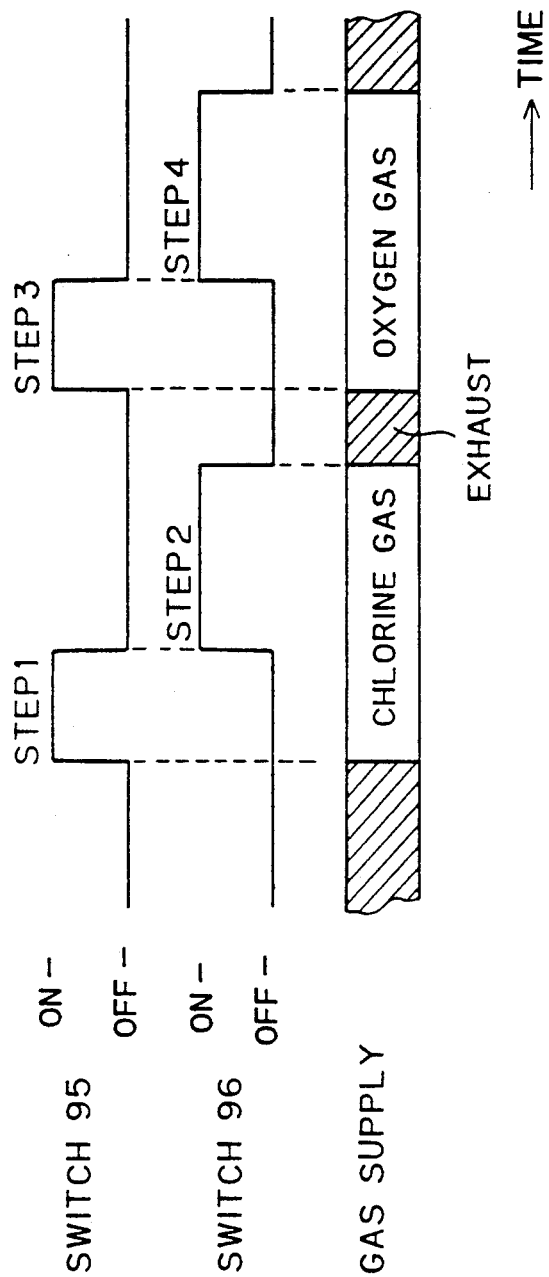
FIG. 2 is a timing chart of plasma cleaning according to the first preferred embodiment.

The first switch 95 is closed, with reference to FIG. 2. This permits the high-frequency electric field to be applied across the first and second electrodes 61 and 71, so that the plasma of the chlorine gas is produced in the clearance 51a. The plasma of the chlorine gas reacts with the aluminiferous constituents contained in the reaction products which stick to the electrodes 61 and 71 to gasify the reaction products. The gasified reaction products are discharged to the outside of the chamber 50 through the outlet 54.

Second Step

While the chlorine gas is introduced into the internal space 51, the first switch 95 is opened and the second switch 96 is closed. This permits the high-frequency voltage from the high-frequency power source 100 to be applied across the first electrode 61 and conductive block 90, so that the plasma of the chlorine gas is produced and covers the inner wall surface of the chamber 50 in the internal space 51. The plasma gasifies the aluminiferous constituents contained in the reaction products which stick to the conductive block 90. The gasified reaction products are discharged to the outside of the chamber 50 through the outlet 54.

The second switch 96 is opened, and the introduction of the chlorine gas into the internal space 51 is cut off.

In the first and second steps wherein the chlorine gas is used, the plasma is produced between the first and second electrodes 61 and 71 and, subsequently, between the first electrode 61 and the conductive block 90. This sequence may be reversed. That is, the plasma may be produced first between the first electrode 61 and the conductive block 90 and, thereafter, between the first and second electrodes 61 and 71.

Third Step

The vacuum pump 56 applies suction to the internal space 51 to exhaust the gas in the internal space 51. Thereafter, the oxygen gas is introduced from the reactive gas supply mechanism 80 into the internal space 51. The first switch 95 is closed, so that the high-frequency electric field is applied across the first and second electrodes 61 and 71. This provides for the production of the plasma of the oxygen gas in the clearance 51a. Carbonaceous reaction products which stick to the electrodes 61 and 71 are gasified by the plasma of the oxygen gas to be discharged to the outside of the chamber 50 through the outlet 54.

Fourth Step

The first switch 95 is opened and the second switch 96 is closed, so that the high-frequency electric field is applied across the first electrode 61 and conductive block 90. This provides for the production of the plasma of the oxygen gas between the first electrode 61 and the conductive block 90. Carbonaceous reaction products which stick to the conductive block 90 are gasified by the plasma to be exhausted.

Subsequently, the second switch 96 is opened, and the introduction of the oxygen gas is cut off. After the exhaust of the gas in the internal space 51, the vacuum pump 56 is stopped. This completes the plasma cleaning.

In the plasma processing using the oxygen gas, the plasma is produced between the first and second electrodes 61 and 71 and, thereafter, between the first electrode 61 and the conductive block 90. This sequence may be reversed.

Since the inner wall surface of the conductive block 90 has a considerably large surface area, it is preferable that cleaning periods in the second and fourth steps are longer than those in the first and third steps.

As above described, the plasma cleaning by the RIE apparatus AP1 includes the step of producing the plasma of the reactive gases between the first electrode 61 and the conductive block 90 mounted over the inner wall surface of the chamber 50. This enables the conductive block 90 to be exposed to the plasma of the reactive gases, so that the reaction products which stick to the conductive block 90 are eliminated. All of the reaction products which stick to the portions inside the chamber 50 are eliminated.

Variations of Selective Voltage Supply Unit in First Preferred Embodiment

Figure 3:
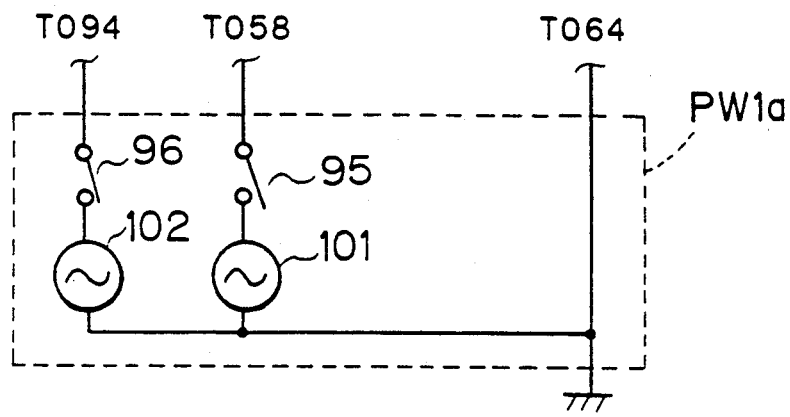
FIGS. 3 and 4 show variations of a selective voltage supply unit employable in the first preferred embodiment, respectively.

FIG. 3 shows a selective voltage supply unit PW1a substitutable for the selective voltage supply unit PW1 of the RIE apparatus AP1 shown in FIG. 1. With reference to FIG. 3, the selective voltage supply unit PW1a includes a first high-frequency power source 101 whose one end is connected to the connection 58 of FIG. 1 through the first switch 95 and a second high-frequency power source 102 whose one end is connected to the lead 94 of FIG. 1 through the second switch 96. The respective other ends of the power sources 101 and 102 are connected to the extraction electrode 64 extending from the first electrode 61.

In the RIE apparatus employing the selective voltage supply unit PW1a, only the first switch 95 may be closed to apply the high-frequency voltage across the first and second electrodes 61 and 71 in the time period of the plasma etching of the semiconductor wafer and in the time periods of the first and third steps in the plasma cleaning.

Only the second switch 96 may be closed to apply the high-frequency voltage between the first electrode 61 and the conductive block 90 in the time periods of the second and fourth steps in the plasma cleaning.

Figure 4:
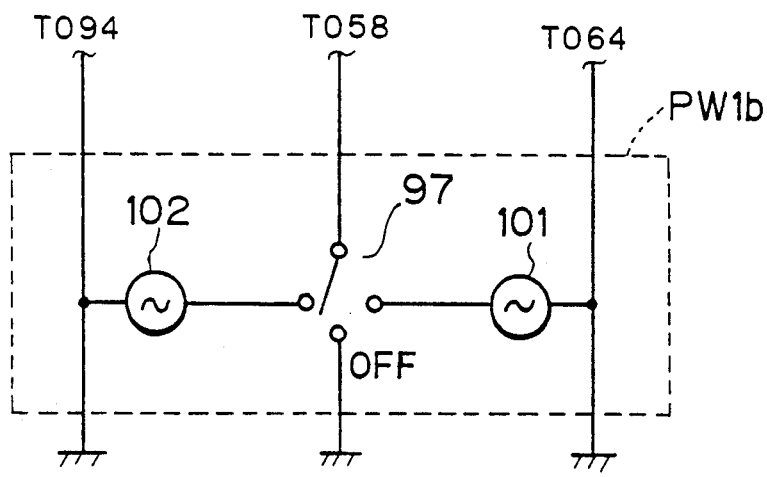

Although the plasma is produced between the first electrode 61 and the conductive block 90 for the plasma cleaning in the first preferred embodiment, the present invention is not limited to this. The plasma may be produced between the second electrode 71 and the conductive block 90. A variation of the selective voltage supply unit employable in this case is shown in FIG. 4. In a selective voltage supply unit PW1b, as shown in FIG. 4, the high-frequency voltage is supplied from the first or second high-frequency power source 101, 102, and switching from one of the high-frequency power sources to the other is carried out by means of a switch 97.

Second Preferred Embodiment

Figure 5:
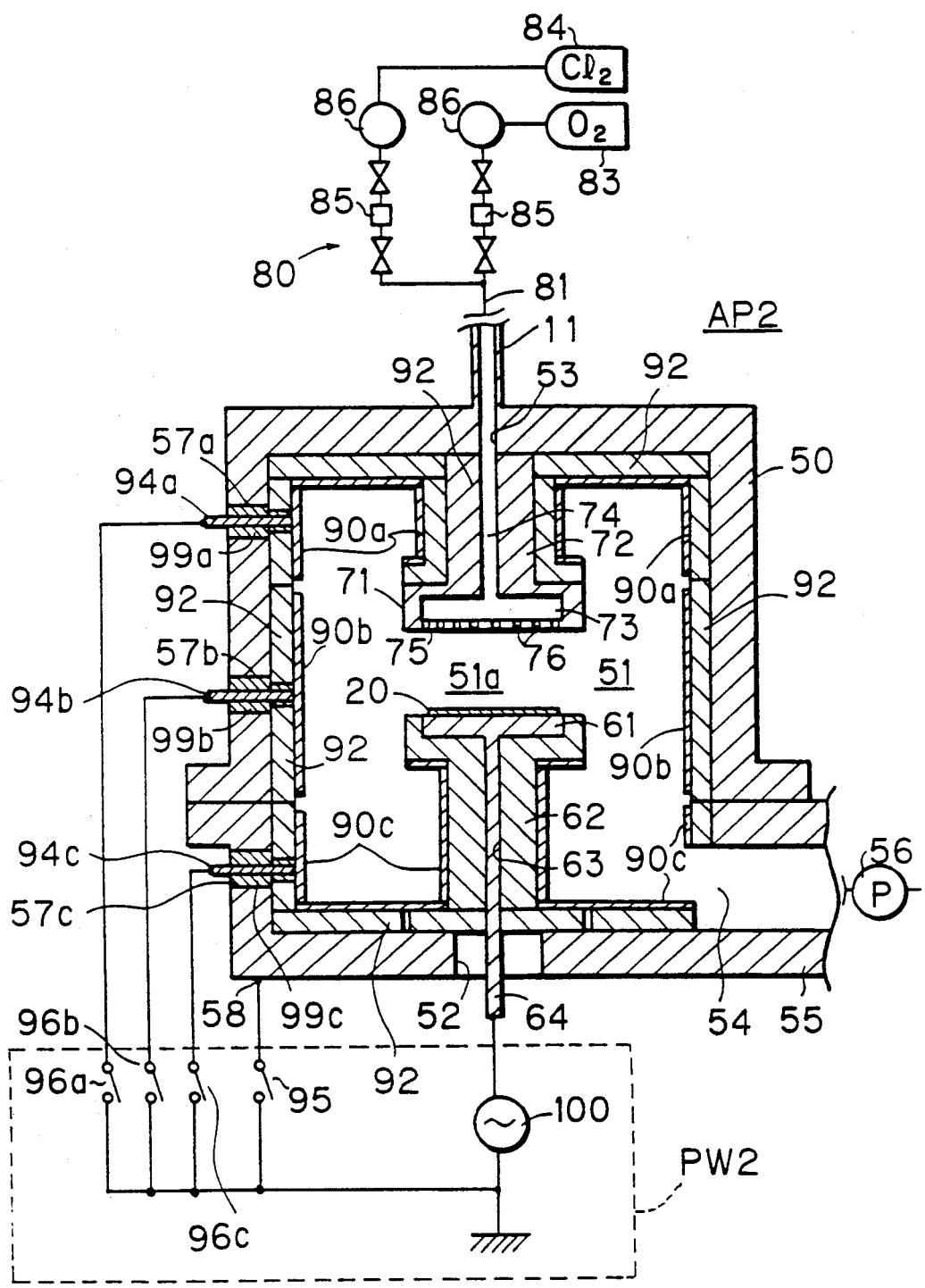
FIG. 5 is a schematic cross-sectional view of the plasma processing apparatus according to a second preferred embodiment of the present invention.

FIG. 5 is a schematic cross-sectional view of a RIE apparatus AP2 according to a second preferred embodiment of the present invention.

Referring to FIG. 5, a first conductive block 90a is mounted on an upper region of the inner wall surface of the chamber 50 and over the outer periphery of the pillar 72 for supporting the second electrode 71. A second conductive block 90b is mounted on a middle region of the inner wall surface of the chamber 50 through the insulator 92 in insulated relation to the first conductive block 90a.

A third conductive block 90c is mounted on a lower region of the inner wall surface of the chamber 50 and over the outer periphery of the insulator 62 for supporting the first electrode 61 in insulated relation to the first and second conductive blocks 90a and 90b. The insulators 92 are inserted between the chamber 50 and the conductive blocks 90a, 90b, 90c and between the first conductive block 90a and the conductor 72 similarly to the first preferred embodiment.

Lead insertion holes 57a, 57b, 57c are formed in the insulators 92 and side wall of the chamber 50 in respectively corresponding relation to the conductive blocks 90a, 90b, 90c. Leads 94a, 94b, 94c are inserted in the lead insertion holes 57a, 57b, 57c, respectively. The leads 94a, 94b, 94c are, at respective one end, connected electrically to the conductive blocks 90a, 90b, 90c, respectively, and are, at the respective other end, located outside of the chamber 50. Insulators 99a, 99b, 99c are attached to the outer periphery of the leads 94a, 94b, 94c, respectively, so that the leads 94a, 94b, 94c are electrically insulated from the chamber 50.

The extraction electrode 64 extending from the first electrode 61 is connected to one electrode of the high-frequency power source 100. The connection 58 of the chamber 50 is connected to the other electrode of the high-frequency power source 100 through the first switch 95. The leads 94a, 94b, 94c are connected to the other electrode of the high-frequency power source 100 through second to fourth switches 96a, 96b, 96c, respectively. The switches 95, 96a, 96b, 96c and power source 100 constitute a selective voltage supply unit PW2.

Since the other construction of the RIE apparatus AP2 is similar to that of the RIE apparatus AP1 of the first preferred embodiment, like reference numerals are used to designate identical elements and the description thereof is omitted.

Etching and Plasma Cleaning in Second Preferred Embodiment

The etching by the RIE apparatus AP2 is as follows. While the chlorine gas is introduced into the internal space 51, only the first switch 95 is closed, to apply the high-frequency voltage across the first and second electrodes 61 and 71.

This provides for the execution of the plasma etching similar to that of the first preferred embodiment.

For the plasma cleaning by the RIE apparatus AP2, the following steps are carried out.

First Step

While the pressure in the internal space 51 is reduced by the vacuum pump 56, the chlorine gas is introduced from the reactive gas supply mechanism 80 into the internal space 51.

Figure 6:
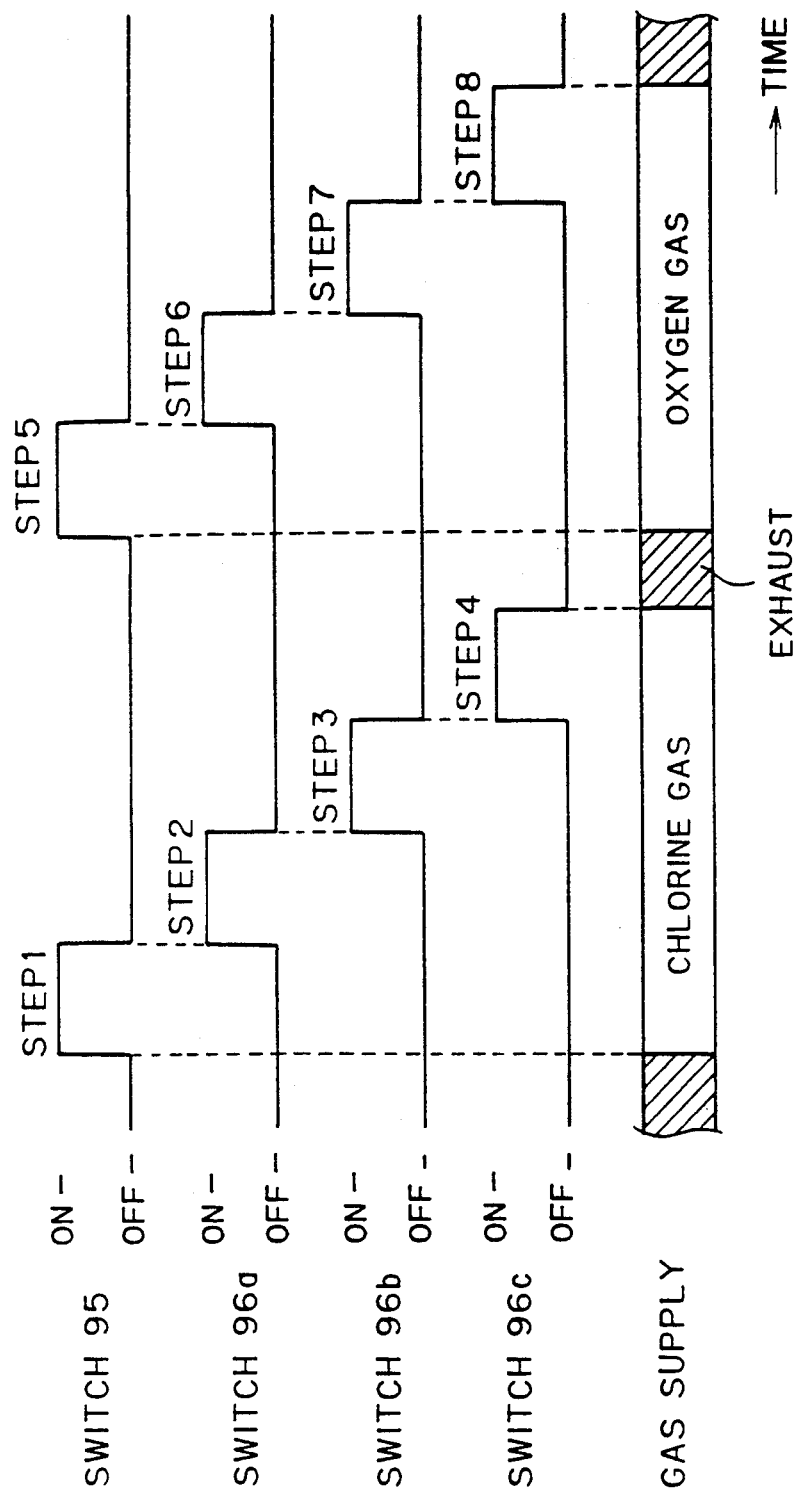
FIG. 6 is a timing chart of the plasma cleaning according to the second preferred embodiment.

Only the first switch 95 is closed, with reference to FIG. 6. This permits the high-frequency electric field to be applied across the first and second electrodes 61 and 71, so that the plasma of the chlorine gas is produced in the clearance 51a. Both of the electrodes 61 and 71 are exposed to the plasma of the chlorine gas. The aluminiferous reaction products which stick to the electrodes 61 and 71 are gasified. The gasified reaction products are discharged to the outside of the chamber 50 through the outlet 54.

Second Step

While the chlorine gas is introduced into the internal space 51, the first switch 95 is opened and the second switch 96a is closed. This permits the high-frequency voltage from the high-frequency power source 100 to be applied across the first electrode 61 and first conductive block 90a. The plasma of the chlorine gas is produced between the first electrode 61 and the first conductive block 90a. The aluminiferous reaction products which stick to the first conductive block 90a are gasified by the plasma to be exhausted.

Third Step

With the introduction of the chlorine gas into the internal space 51 maintained, the second switch 96a is opened and the third switch 96b is closed. This permits the high-frequency voltage from the high-frequency power source 100 to be applied across the first electrode 61 and second conductive block 90b. The plasma of the chlorine gas is produced between the first electrode 61 and the second conductive block 90b. The aluminiferous reaction products which stick to the second conductive block 90b are gasified by the plasma to be exhausted.

Fourth Step

With the introduction of the chlorine gas into the internal space 51 maintained, the third switch 96b is opened and the fourth switch 96c is closed. This permits the high-frequency voltage from the high-frequency power source 100 to be applied across the first electrode 61 and third conductive block 90c. The plasma of the chlorine gas is produced between the first electrode 61 and the third conductive block 90c. The aluminiferous reaction products which stick to the third conductive block 90c are gasified by the plasma to be exhausted.

The sequence of the executions of the first to fourth steps may be changed.

Fifth to Eighth Steps

After the exhaust of the gas in the internal space 51, the oxygen gas is introduced into the internal space 51. The switching operations similar to the first to fourth steps are carried out in an atmosphere of the oxygen gas, whereby the carbonaceous reaction products which stick to the electrodes 61, 71 and first to third conductive blocks 90a to 90c are gasified to be exhausted.

In the plasma processing using the oxygen gas, the sequence of the executions of the fifth to eighth steps may be changed fittingly.

The plasma cleaning by the RIE apparatus AP2 is adapted such that the plasma is individually produced for elimination of the reaction products which stick to the plurality of conductive blocks 90a, 90b, 90c mounted on the inner wall surface of the chamber 50. This enables the produced plasma to concentrate on the respective conductive blocks 90a, 90b, 90c for efficient plasma cleaning, as compared with the simultaneous production of the plasma over the inner wall surface of the chamber 50.

The RIE apparatus AP2 is provided with the three conductive blocks 90a, 90b, 90c in the second preferred embodiment, however, may be provided with four or more conductive blocks.

Variation of Selective Voltage Supply Unit in Second Preferred Embodiment

Figure 7:
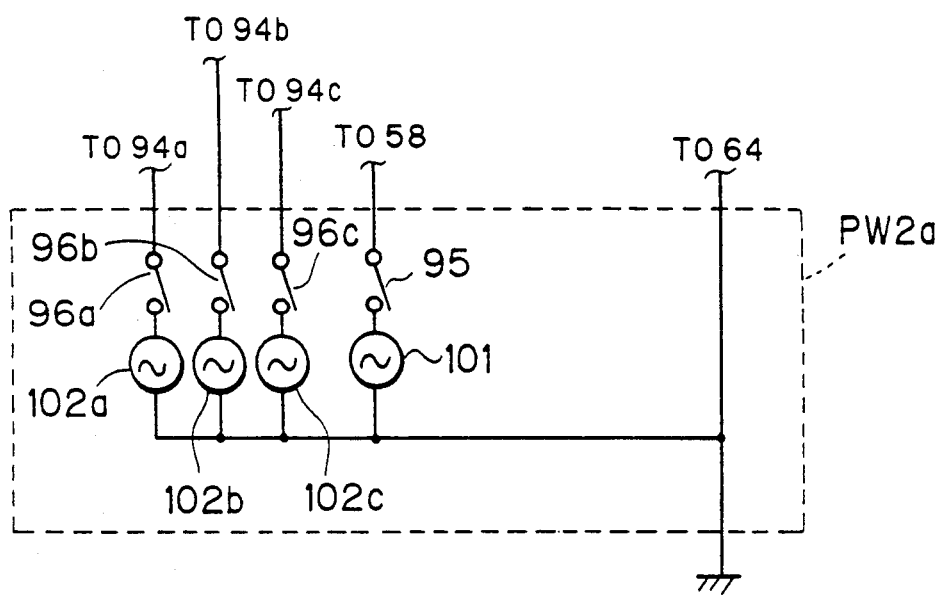
FIG. 7 shows a variation of the selective voltage supply unit employable in the second preferred embodiment.

FIG. 7 shows a selective voltage supply unit PW2a substitutable for the selective voltage supply unit PW2 of the RIE apparatus AP2 shown in FIG. 5. The selective voltage supply unit PW2a includes high-frequency power sources 101, 102a, 102b, 102c in respectively corresponding relation to the switches 95, 96a, 96b, 96c. By selectively closing the switches 95, 96a, 96b, 96c, the high-frequency voltage is supplied from one of the high-frequency power sources 101, 102a, 102b, 102c which corresponds to the closed switch for the purpose of the production of the plasma.

In the second preferred embodiment, the plasma is adapted to be produced between the first electrode 61 and the conductive blocks 90a, 90b, 90c for the plasma cleaning. The present invention is not limited to this, and the plasma may be produced between the second electrode 71 and the conductive blocks 90a, 90b, 90c, or among the respective conductive blocks 90a, 90b and 90c.

Apparatus of Third Preferred Embodiment

Figure 8:
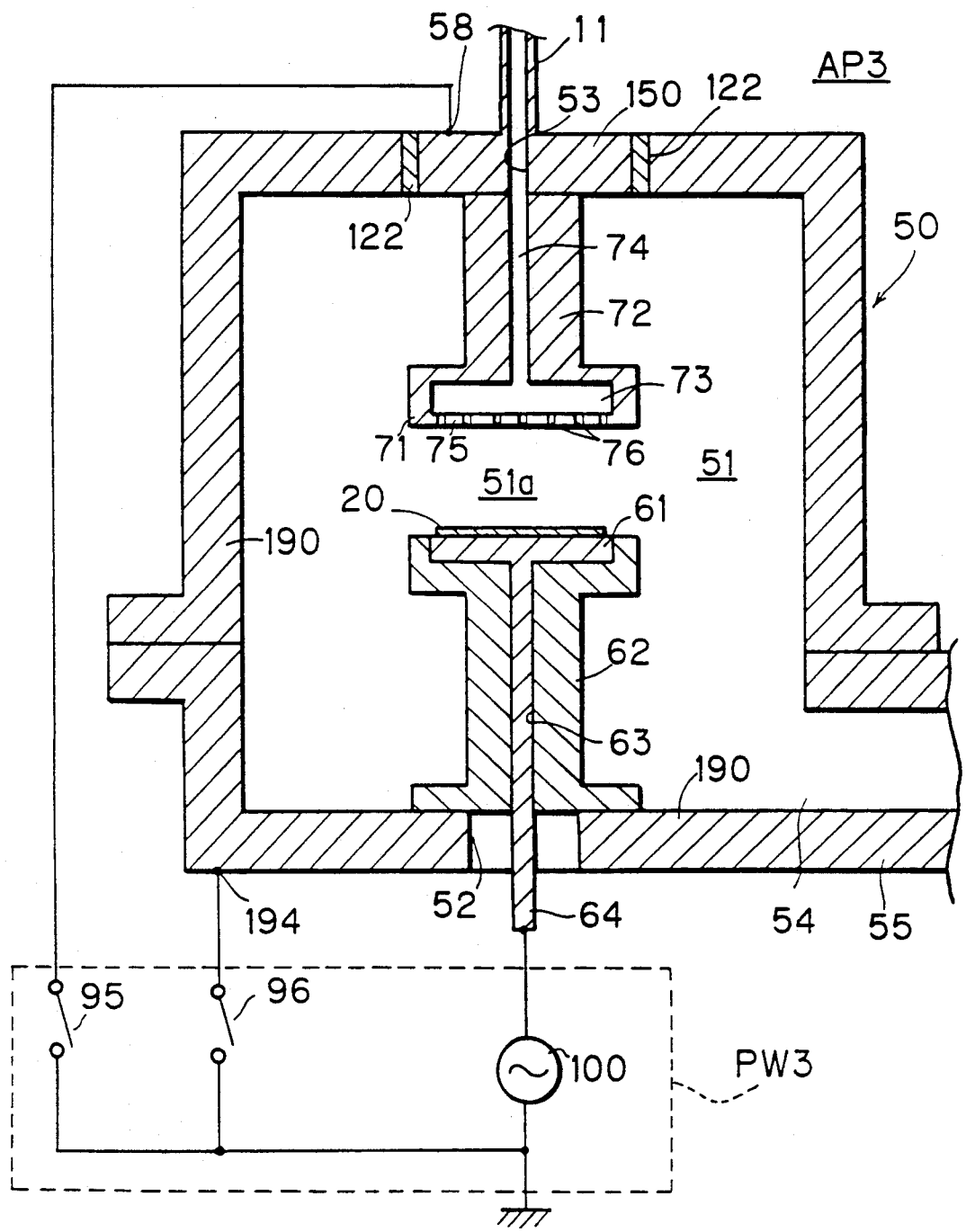
FIG. 8 is a schematic cross-sectional view of the plasma processing apparatus according to a third preferred embodiment of the present invention.

FIG. 8 is a schematic cross-sectional view of an RIE apparatus AP3 according to a third preferred embodiment of the present invention. With reference to FIG. 8, the chamber 50 which is an aluminium or stainless steel conductor includes a support portion 150 for supporting the second electrode 71 through the pillar 72 in the center of the ceiling wall of the chamber 50 and a chamber main body 190 which is the portion other than the support portion 150. Insulators 122 are inserted between the support portion 150 and the chamber main body 190 to electrically insulate the support portion 150 and chamber main body 190 from each other.

The connection 58 on the support portion 150 is connected to one electrode of the high-frequency power source 100 through the first switch 95. A connection 194 on the chamber main body 190 is connected to the one electrode of the high-frequency power source 100 through the second switch 96. The other electrode of the high-frequency power source 100 is connected to the first electrode 61 through the extraction electrode 64. The switches 95, 96 and high-frequency power source 100 constitute a selective voltage supply unit PW3.

The other construction of the RIE apparatus AP3 is similar to that of the RIE apparatus AP1 of the first preferred embodiment.

Etching and Plasma Cleaning in Third Preferred Embodiment

For the etching by the RIE apparatus AP3, only the first switch 95 is closed to produce a chlorinous plasma between the first and second electrodes 61 and 71.

The plasma cleaning by the RIE apparatus AP3 is as follows. Initially, the first switch 95 is closed to produce the plasma between the first and second electrodes 61 and 71, so that the cleaning in the vicinity of the electrodes 61 and 71 is executed.

The first switch 95 is opened and the second switch

The first switch 95 is opened and the second switch 96 is closed to produce the plasma between the first electrode 61 and the chamber main body 190. This permits the plasma cleaning to be executed in the vicinity of the wall surface of the chamber 50 in the internal space 51. The switching of the chlorine and oxygen gases is similar to that of the first preferred embodiment.

In the RIE apparatus AP3, a conductor may be mounted over the outer peripheral surface of the insulator 62 for supporting the first electrode 61 so that the plasma of the reactive gas is produced also in the vicinity of the conductor. Furthermore, a conductor may be mounted over the outer peripheral surface of the conductor 72 for supporting the second electrode 71 through an insulator so that the plasma of the reactive gas is produced also in the vicinity of the conductor.

The third preferred embodiment, in which the main body 190 of the chamber 50 also serves as an electrode for the plasma cleaning, has the advantage that there is no need to provide an electrode to be exclusively used for the plasma cleaning.

When the outer wall of the chamber 50 is not coated with an insulator, the ground level side terminal of the high-frequency power source 100 is preferably connected to the chamber main body 190, as shown in FIG. 8, to prevent leakage of the high-frequency current from the chamber 50 to the outside and electric shock when an operator accidentally touches the chamber 50.

Fourth Preferred Embodiment

Figure 9:
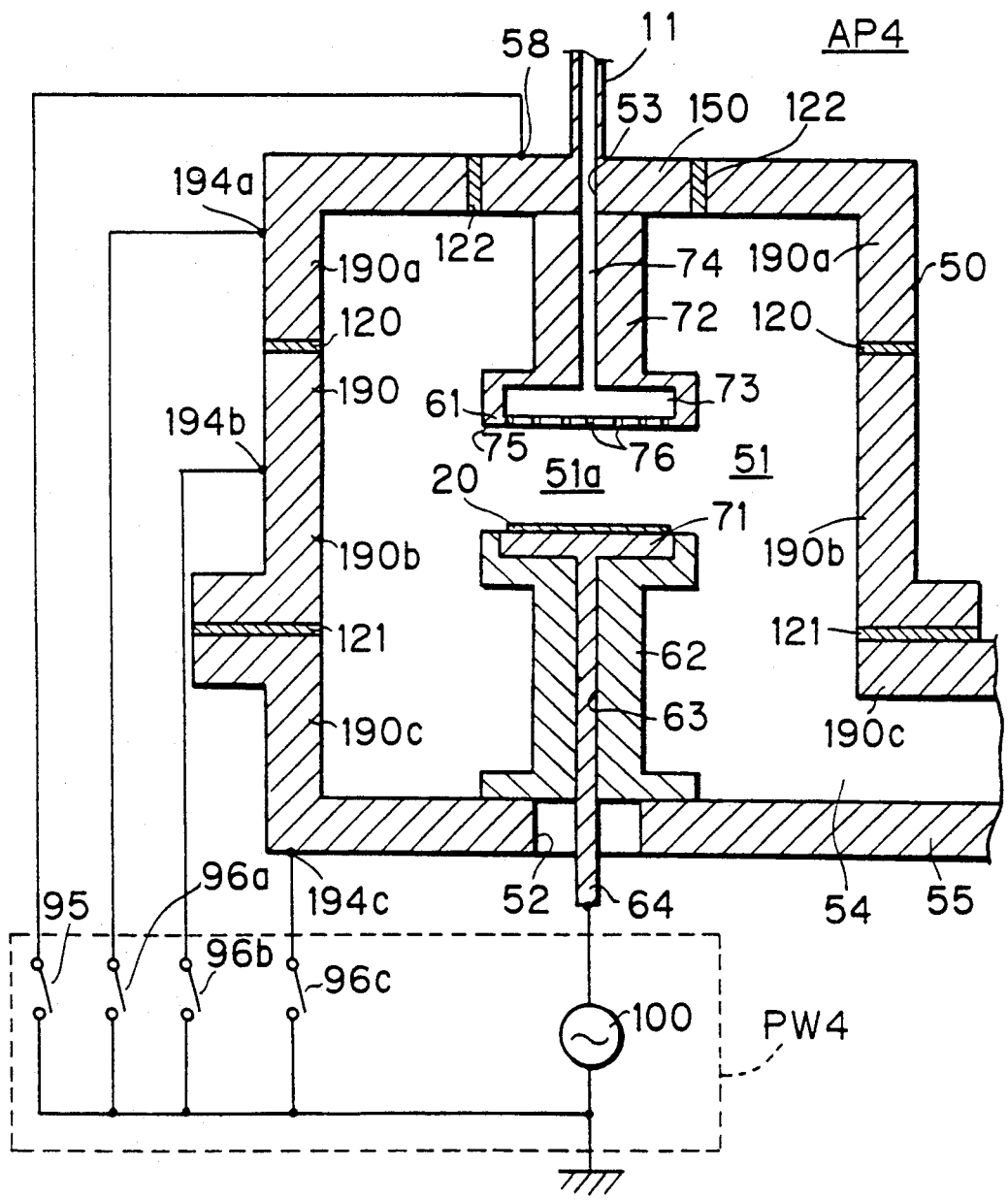
FIG. 9 is a schematic cross-sectional view of the plasma processing apparatus according to a fourth preferred embodiment of the present invention.

FIG. 9 shows a major part of a RIE apparatus AP4 according to a fourth preferred embodiment of the present invention. In the apparatus AP4, the main body 190 of the chamber 50 is divided into first to third partial chambers 190a to 190c. Insulators 120 are inserted between the first partial chamber 190a which lies on the upper side and the second partial chamber 190b which lies in the middle, to electrically insulate the partial chambers 190a and 190b from each other. Insulators 121 are inserted between the second partial chamber 190b and the third partial chamber 190c which lies on the lower side, to electrically insulate the partial chambers 190b and 190c from each other. The first and third partial chambers 190a and 190c are not in contact with each other, and are electrically insulated from each other.

The first to third partial chambers 190a to 190c are connected to the high-frequency power source 100 through connections 194a to 194c and the switches 96a to 96c, respectively.

The switching operations in the plasma etching and plasma cleaning by using the RIE apparatus AP4 are similar to those in the second preferred embodiment. For the cleaning of the wall surface of the chamber 50, the plasma is sequentially produced in the vicinity of the first to third partial chambers 190a to 190c to eliminate the reaction products which stick to the first to third partial chambers 190a to 190c.

The other construction and operation of the RIE apparatus AP4 are similar to those in the first to third preferred embodiments.

Modification

The present invention is applicable to plasma processing apparatuses other than the RIE apparatus, for example, CVD apparatuses. The type of reactive gas is not limited.

While the invention has been shown and described in detail, the foregoing description is in all aspects illustrative and not restrictive. It is therefore understood that numerous modifications and variations can be devised without departing from the scope of the invention.

What is claimed is:

1. A plasma processing apparatus for performing a plasma processing on a material to be processed, comprising:
   (a) a chamber having an internal space;
   (b) a reactive gas supply mechanism connected to said chamber for introducing a reactive gas into said internal space of said chamber;
   (c) an exhaust mechanism connected to said chamber;
   (d) a first electrode conductor disposed in said internal space of said chamber and being capable of placing said material thereon;
   (e) a second electrode conductor disposed opposite to said first electrode conductor in said internal space of said chamber and insulated electrically from said first electrode conductor;
   (f) a conductive block mounted on an inner wall surface of said chamber in electrically insulated relation to said chamber and insulated electrically from said first and second electrode conductors; and
   (g) selective voltage supply means connected to said first and second electrode conductors and to said conductive block and being capable of switching from a first voltage supply mode to a second voltage supply mode, and vice versa, said first voltage supply mode being a mode in which voltage is applied across said first and second electrode conductors, said second voltage supply mode being a mode in which voltage is applied across said conductive block and one of said first and second electrode conductors.

2. The plasma processing apparatus of claim 1, further comprising
   (h) a first insulator for covering an inner wall of said chamber,
   wherein said conductive block includes
   (f-1) a first portion mounted on said first insulator.

3. The plasma processing apparatus of claim 2, wherein said first electrode conductor includes:
   (d-1) a first conductive portion having a flat major surface capable of placing said material thereon; and
   (d-2) a second conductive portion extending from said first conductive portion to an outside of said chamber,
   said plasma processing apparatus further comprising
   (i) a second insulator for covering a region of said first conductive portion which lies in said internal space, and
   wherein said conductive block includes
   (f-2) a second portion mounted on said second insulator.

4. The plasma processing apparatus of claim 3, wherein said second electrode conductor includes:
   (e-1) a pillar connected to said chamber and having therein a reactive gas passageway which communicates with said reactive gas supply mechanism; and
   (e-2) a gas injection head supported by said pillar and having a plurality of gas jets injecting into said internal space said reactive gas supplied from said reactive gas supply mechanism through said reactive gas passageway,
   said plasma processing apparatus further comprising
   (j) a third insulator for covering said pillar, and
   wherein said conductive block includes
   (f-3) a third portion mounted on said third insulator.

5. The plasma processing apparatus of claim 4, wherein said selective voltage supply means includes:
   (g-1) a single high-frequency power source having first and second terminals, said first terminal being electrically connected to said first electrode conductor; and
   (g-2) switching means for connecting said second terminal of said high-frequency power source selectively to said second electrode conductor and said conductive block.

6. The plasma processing apparatus of claim 4, wherein said selective voltage supply means includes:
   (g-3) a first high-frequency power source having a first terminal electrically connected to said first electrode conductor and a second terminal electrically connected to said second electrode conductor through first switching means; and
   (g-4) a second high-frequency power source having a first terminal electrically connected to said first electrode conductor and a second terminal electrically connected to said conductive block through second switching means.

7. The plasma processing apparatus of claim 4, wherein said reactive gas supply mechanism includes:
   (b-1) first gas cylinder means for storing a first reactive gas therein;
   (b-2) second gas cylinder means for storing a second reactive gas therein; and
   (b-3) selective gas introduction means for selectively introducing said first and second reactive gases into said internal space of said chamber.

8. A plasma processing apparatus for performing a plasma processing on a material to be processed, comprising:
   (a) a chamber having an internal space;
   (b) a reactive gas supply mechanism connected to said chamber for introducing a reactive gas into said internal space of said chamber;
   (c) an exhaust mechanism connected to said chamber;

(d) a first electrode conductor disposed in said internal space of said chamber and being capable of placing said material thereon;

(e) a second electrode conductor disposed opposite to said first electrode conductor in said internal space of said chamber and insulated electrically from said first electrode conductor;

(f) a plurality of conductive blocks mounted on an inner wall surface of said chamber in electrically insulated relation to said first and second electrode conductors and insulated electrically from each other; and (g) selective voltage supply means connected to said first and second electrode conductors and to said plurality of conductive blocks and being capable of switching from a first voltage supply mode to at least one of second and third voltage supply modes, and vice versa, said first voltage supply mode being a mode in which voltage is applied across said first and second electrode conductors, said second voltage supply mode being a mode in which voltage is applied selectively across one of said first and second electrode conductors and said plurality of conductive blocks, said third voltage supply mode being a mode in which voltage is applied accross said plurality of conductive blocks.

9. The plasma processing apparatus of claim 8, further comprising (h) a first insulator for covering an inner wall of said chamber, wherein said plurality of conductive blocks are spaced apart from each other on said first insulator.

10. The plasma processing apparatus of claim 9, wherein said first electrode conductor includes:

(d-1) a first conductive portion having a flat major surface capable of placing said material thereon; and (d-2) a second conductive portion extending from said first conductive portion to an outside of said chamber, said plasma processing apparatus further comprising (i) a second insulator for covering a region of said second conductive portion which lies in said internal space, and wherein said plurality of conductive blocks include (f-1) a first conductive block extending on said second insulator.

11. The plasma processing apparatus of claim 10, wherein said second electrode conductor includes:

(e-1) a pillar connected to said chamber and having therein a reactive gas passageway which communicates with said reactive gas supply mechanism; and (e-2) a gas injection head supported by said pillar and having a plurality of gas jets injecting into said internal space said reactive gas supplied from said reactive gas supply mechanism through said reactive gas passageway, said plasma processing apparatus further comprising (j) a third insulator for covering said pillar, and wherein said plurality of conductive blocks include (f-2) a second conductive block mounted on said third insulator.

12. The plasma processing apparatus of claim 11, wherein said selective voltage supply means includes:

(g-1) a single high-frequency power source having first and second terminals, said first terminal being electrically connected to said first electrode conductor; and (g-2) switching means for connecting said second terminal of said high-frequency power source selectively to said second electrode conductor and said plurality of conductive blocks.

13. The plasma processing apparatus of claim 11, wherein said selective voltage supply means includes:

(g-3) a first high-frequency power source having a first terminal electrically connected to said first electrode conductor and a second terminal electrically connected to said second electrode conductor through first switching means; and (g-4) a second high-frequency power source having a first terminal electrically connected to said first electrode conductor and a second terminal electrically connected to said plurality of conductive blocks through second switching means.

14. The plasma processing apparatus of claim 11, wherein said reactive gas supply mechanism includes:

(b-1) first gas cylinder means for storing a first reactive gas therein;

(b-2) second gas cylinder means for storing a second reactive gas therein; and (b-3) selective gas introduction means for selectively introducing said first and second reactive gases into said internal space of said chamber.

15. A plasma processing apparatus for performing a plasma processing on a material to be processed, comprising:

(a) a conductive chamber having an internal space;

(b) a reactive gas supply mechanism connected to said chamber for introducing a reactive gas into said internal space of said chamber;

(c) an exhaust mechanism connected to said chamber;

(d) a first electrode conductor disposed in said internal space of said chamber and insulated electrically from said chamber, said first electrode conductor being capable of placing said material thereon;

(e) a second electrode conductor disposed opposite to said first electrode conductor in said internal space of said chamber and insulated electrically from said chamber and said first electrode conductor; and (f) selective voltage supply means connected to said first and second electrode conductors and to said chamber and being capable of switching from a first voltage supply mode to a second voltage supply mode, and vice versa, said first voltage supply mode being a mode in which voltage is applied across said first and second electrode conductors, said second voltage supply mode being a mode in which voltage is applied across said chamber and one of said first and second electrode conductors.

16. The plasma processing apparatus of claim 15, wherein said selective voltage supply means includes:

(f-1) high-frequency power source means having first and second terminals, said first terminal being electrically connected to said first electrode conductor; and (f-2) switching means for connecting said second terminal of said high-frequency power source means selectively to said second electrode conductor and said chamber.

17. The plasma processing apparatus of claim 16, wherein said first terminal of said high-frequency power source means is grounded.

18. The plasma processing apparatus of claim 17, wherein said reactive gas supply mechanism includes:

(b-1) first gas cylinder means for storing a first reactive gas therein;

(b-2) second gas cylinder means for storing a second reactive gas therein; and
(b-3) selective gas introduction means for selectively introducing said first and second reactive gases into said internal space of said chamber.

19. A plasma processing apparatus for performing a plasma processing on a material to be processed, comprising:
(a) a chamber having an internal space and a plurality of conductive portions insulated electrically from each other;
(b) a reactive gas supply mechanism connected to said chamber for introducing a reactive gas into said internal space of said chamber;
(c) an exhaust mechanism connected to said chamber;
(d) a first electrode conductor disposed in said internal space of said chamber and insulated electrically from said plurality of conductive portions, said first electrode conductor being capable of placing said material thereon;
(e) a second electrode conductor disposed opposite to said first electrode conductor in said internal space of said chamber and insulated electrically from said plurality of conductive portions and said first electrode conductor; and
(f) selective voltage supply means connected to said first and second electrode conductors and to said plurality of conductive portions and being capable of switching from a first voltage supply mode to at least one of second and third voltage supply modes, and vice versa, said first voltage supply mode being a mode in which voltage is applied across said first and second electrode conductors, said second voltage supply mode being a mode in which voltage is applied selectively across one of said first and second electrode conductors and said plurality of conductive portions, said third voltage supply mode being a mode in which voltage is applied across said plurality of conductive portions.

20. The plasma processing apparatus of claim 19, further comprising
(g) a first insulator inserted between said plurality of conductive portions.

21. The plasma processing apparatus of claim 20, further comprising
(h) a second insulator inserted between said first electrode conductor and a first conductive portion which is adjacent to said first electrode conductor among said plurality of conductive portions.

22. The plasma processing apparatus of claim 21, wherein said selective voltage supply means includes:
(f-1) high-frequency power source means having first and second terminals, said first terminal being electrically connected to said first electrode conductor; and
(f-2) switching means for connecting said second terminal of said high-frequency power source means selectively to said second electrode conductor and said plurality of conductive portions.

23. The plasma processing apparatus of claim 22, wherein said reactive gas supply mechanism includes:
(b-1) first gas cylinder means for storing a first reactive gas therein;
(b-2) second gas cylinder means for storing a second reactive gas therein; and
(b-3) selective gas introduction means for selectively introducing said first and second reactive gases into said internal space of said chamber.

24. A plasma cleaning method for use in a plasma processing apparatus adapted such that first and second electrode conductors are disposed opposite to each other in an internal space of a chamber and such that voltage is applied across said first and second electrode conductors, said method comprising the steps of:
(a) introducing a reactive gas into said internal space of said chamber; and
(b) producing a plasma of said reactive gas by applying voltage across one of said first and second electrode conductors and a conductive block mounted on an inner wall surface of said chamber in parallel with said step (a) to clean an inside portions of said chamber by said plasma.

25. The plasma cleaning method of claim 24,
wherein a first reaction product containing carbon and a second reaction product containing metal stick to exposed members provided in said plasma processing apparatus,
said plasma cleaning method being carried out to eliminate said first and second reaction products,
said step (a) including the step of
(a-1) introducing a first gas containing chlorine into said internal space of said chamber,
said step (b) including the step of
(b-1) producing a plasma of said first gas by applying voltage across one of said first and second electrode conductors and said conductive block in parallel with said step (a-1) to eliminate said first reaction product by said plasma of said first gas,
said plasma cleaning method further comprising the steps of:
(c) exhausting said first gas from said internal space after completion of said step (b-1);
(d) introducing a second gas containing oxygen into said internal space of said chamber after completion of said step (c); and
(e) producing a plasma of said second gas by applying voltage across one of said first and second electrode conductors and said conductive block in parallel with said step (d) to eliminate said second reaction product by said plasma of said second gas.

26. A plasma cleaning method for use in a plasma processing apparatus adapted such that first and second electrode conductors are disposed opposite to each other in an internal space of a chamber and such that voltage is applied across said first and second electrode conductors, said method comprising the steps of:
(a) introducing a reactive gas into said internal space of said chamber;
(b) producing a plasma of said reactive gas by applying voltage across one of said first and second electrode conductors and one conductive block selected among a plurality of conductive blocks mounted on an inner wall surface of said chamber and insulated from each other in parallel with said step (a) to clean an inside portion of said chamber by said plasma; and
(c) repeating said step (b) while sequentially selecting each of said plurality of conductive blocks as said one conductive block.

27. The plasma cleaning method of claim 26,
wherein a first reaction product containing carbon and a second reaction product containing metal stick to exposed members provided in said plasma processing apparatus,
said plasma cleaning method being carried out to eliminate said first and second reaction products, said step (a) including the step of (a-1) introducing a first gas containing chlorine into said internal space of said chamber, said step (b) including the step of (b-1) producing a plasma of said first gas by applying voltage across one of said first and second electrode conductors and said one conductive block in parallel with said step (a-1) to eliminate said first reaction product by said plasma of said first gas.

28. The plasma cleaning method of claim 27, wherein said step (a) further includes the steps of:

(a-2) exhausting said first gas from said internal space after completion of said step (b-1); and (a-3) introducing a second gas containing oxygen into said internal space of said chamber after completion of said step (a-2), wherein said step (b) further includes the step of (b-2) producing a plasma of said second gas by applying voltage across one of said first and second electrode conductors and said one conductive block in parallel with said step (a-3) to eliminate said second reaction product by said plasma of said second gas.

29. A plasma cleaning method for use in a plasma processing apparatus adapted such that first and second electrode conductors are disposed opposite to each other in an internal space of a chamber and such that voltage is applied across said first and second electrode conductors, said method comprising the steps of:

(a) introducing a reactive gas into said internal space of said chamber; and (b) producing a plasma of said reactive gas by applying voltage across one of said first and second electrode conductors and a conductive portion exposed to an inner wall surface of said chamber in parallel with said step (a) to clean an inside portion of said chamber by said plasma.

30. The plasma cleaning method of claim 29, wherein a first reaction product containing carbon and a second reaction product containing metal stick to exposed members provided in said plasma processing apparatus, said plasma cleaning method being carried out to eliminate said first and second reaction products, said step (a) including the step of (a-1) introducing a first gas containing chlorine into said internal space of said chamber, said step (b) including the step of (b-1) producing a plasma of said first gas by applying voltage across one of said first and second electrode conductors and said conductive portion in parallel with said step (a-1) to eliminate said first reaction product by said plasma of said first gas, said plasma cleaning method further comprising the steps of:

(c) exhausting said first gas from said internal space after completion of said step (b-1);

(d) introducing a second gas containing oxygen into said internal space of said chamber after completion of said step (c); and (e) producing a plasma of said second gas by applying voltage across one of said first and second electrode conductors and said conductive portion in parallel with said step (d) to eliminate said second reaction product by said plasma of said second gas.

31. A plasma cleaning method for use in a plasma processing apparatus adapted such that first and second electrode conductors are disposed opposite to each other in an internal space of a chamber and such that voltage is applied across said first and second electrode conductors, said method comprising the steps of:

(a) introducing a reactive gas into said internal space of said chamber;

(b) producing a plasma of said reactive gas by applying voltage across one of said first and second electrode conductors and one conductive portion selected among a plurality of conductive portions exposed to an inner wall surface of said chamber and insulated from each other in parallel with said step (a) to clean an inside portion of said chamber by said plasma; and (c) repeating said step (b) while sequentially selecting each of said plurality of conductive portions as said one conductive portion.

32. The plasma cleaning method of claim 31, wherein a first reaction product containing carbon and a second reaction product containing metal stick to exposed members provided in said plasma processing apparatus, said plasma cleaning method being carried out to eliminate said first and second reaction products, said step (a) including the step of (a-1) introducing a first gas containing chlorine into said internal space of said chamber, said step (b) including the step of (b-1) producing a plasma of said first gas by applying voltage across one of said first and second electrode conductors and said one conductive portion in parallel with said step (a-1) to eliminate said first reaction product by said plasma of said first gas.

33. The plasma cleaning method of claim 32, wherein said step (a) further includes the steps of:

(a-2) exhausting said first gas from said internal space after completion of said step (b-1); and (a-3) introducing a second gas containing oxygen into said internal space of said chamber after completion of said step (a-2), wherein said step (b) further includes the step of (b-2) producing a plasma of said second gas by applying voltage across one of said first and second electrode conductor and said one conductive portion in parallel with said step (a-3) to eliminate said second reaction product by said plasma of said second gas.

* * * * *